United States Patent
Tachikawa et al.

(10) Patent No.: US 7,396,269 B2
(45) Date of Patent: Jul. 8, 2008

(54) METHOD FOR FABRICATING ORGANIC EL ELEMENT

(75) Inventors: Tomoyuki Tachikawa, Tokyo (JP); Toru Miyake, Tokyo (JP); Shinichi Handa, Tokyo (JP); Norihito Ito, Tokyo (JP)

(73) Assignee: Dai Nippon Printing Co., Ltd., Tokyo-to (JP)

( * ) Notice: Subject to any disclaimer, the term of this patent is extended or adjusted under 35 U.S.C. 154(b) by 338 days.

(21) Appl. No.: 10/480,364

(22) PCT Filed: Apr. 24, 2003

(86) PCT No.: PCT/JP03/05291

§ 371 (c)(1),
(2), (4) Date: Dec. 9, 2003

(87) PCT Pub. No.: WO03/092333

PCT Pub. Date: Nov. 6, 2003

(65) Prior Publication Data

US 2005/0032453 A1 Feb. 10, 2005

(30) Foreign Application Priority Data

Apr. 24, 2002 (JP) .............................. 2002-122842

(51) Int. Cl.
*H01J 9/00* (2006.01)
(52) U.S. Cl. ...................................................... 445/24
(58) Field of Classification Search ............. 445/23–25; 313/504, 506, 498
See application file for complete search history.

(56) References Cited

U.S. PATENT DOCUMENTS

| 5,742,129 | A | * | 4/1998 | Nagayama et al. .......... 315/167 |
| 5,953,585 | A | | 9/1999 | Miyaguchi et al. |
| 6,395,328 | B1 | | 5/2002 | May |
| 6,617,186 | B2 | | 9/2003 | Kashiwabara |

FOREIGN PATENT DOCUMENTS

| JP | 9-293589 | 11/1997 |
| JP | 11-67461 | 3/1999 |
| JP | 11-144865 | 5/1999 |
| JP | 2002-359074 | 12/2002 |

* cited by examiner

*Primary Examiner*—Joseph L Williams
(74) *Attorney, Agent, or Firm*—Ladas & Parry LLP

(57) ABSTRACT

The main object of the present invention is to provide a method for manufacturing an EL element, capable of preventing deterioration of the element characteristic by the developing agent or the rinsing agent, while providing the advantages of the photolithography method of high light emitting efficiency and taking out efficiency, the manufacturing process simplicity, and the highly sophisticated pattern formation. In order to achieve the above mentioned object, the present invention provides a method for manufacturing an organic EL element comprising at least a patterned organic light emitting layer, wherein the patterning is conducted by etching with a protecting layer pattern laminated on an organic light emitting layer.

12 Claims, 3 Drawing Sheets and an electron, injected from facing electrodes 2, 7, in an
METHOD FOR FABRICATING ORGANIC EL ELEMENT

CROSS REFERENCE TO RELATED APPLICATION

This application is a U.S. National Phase of International Patent Application serial No. PCT/JP03/05291, filed Apr. 24, 2003 which claims the priority of Japanese Patent Application serial No. 2002-122842, filed Apr. 24, 2002.

TECHNICAL FIELD

The present invention relates to a method for manufacturing an electroluminescence (EL) element comprising a pattern formed organic light emitting layer.

BACKGROUND ART

As shown in FIG. 11, an EL element emits light in color corresponding to the fluorescent substance by coupling a hole and an electron, injected from facing electrodes 2, 7, in an organic light emitting layer 5, and exciting a fluorescent substance in the organic light emitting layer 5 by this energy, and it attracts the attention as a white light sheet-form display element.

In particular, since an organic thin film EL display using an organic light emitting material has high light emitting efficiency such that it realizes a high brightness light emission with less than 10 V applied voltage, and capable of emitting light with a simple element structure. Therefore, application thereof to the advertisement which displays a specific pattern by light emission or other inexpensive simple displays is expected.

In the manufacturing of the display using the EL element, in general, an electrode layer and an organic light emitting layer are patterned. As the method for patterning the EL element, there are, a method of depositing the light emitting material on an electrode substrate via a shadow mask, a method of divisional coating of the organic light emitting material by the ink jet method in a pattern, a method of destroying a specific organic light emitting layer by the ultraviolet ray irradiation, a method of pattern printing of an organic light emitting material by the screen printing method, etc. However, in these methods, it is impossible to realize all of, the high light emitting efficiency and light taking out efficiency, the manufacturing process simplicity, and the highly sophisticated pattern formation.

As a means for solving the above mentioned problems, a method for manufacturing an EL element by patterning the organic light emitting layer using a photolithography method has been proposed. According to the method, compared with the conventionally executed patterning method by the deposition, since vacuum equipment comprising a highly accurate alignment mechanism or the like is not needed, the EL element can be manufactured relatively easily and inexpensively.

In contrast, compared with the patterning method using the ink jet method, the photolithography method is preferable in that a pre-process to a structure for helping patterning or a base member is not executed. Furthermore, in accordance with the ejection accuracy of an ink jet method, the photolithography method can be considered as a method more preferable for the highly sophisticated pattern formation.

However, in the photolithography method, a developing agent and a rinsing agent are needed to be used at the time of patterning the resist. Furthermore, since the above mentioned processes are needed to be repeated for three times to enable the full color display of the EL element, penetration of the developing agent or the rinsing agent to the organic light emitting layer brings about deterioration of the element characteristics. Therefore, a method for manufacturing an EL element without the need of the developing agent and the rinsing agent is called for.

DISCLOSURE OF THE INVENTION

Accordingly, an object of the present invention is to provide a method for manufacturing an EL element, capable of solving the above mentioned problems, and preventing deterioration of the element characteristic by the developing agent or the rinsing agent, while providing the advantages of the photolithography method of high light emitting efficiency and taking out efficiency, the manufacturing process simplicity, and the highly sophisticated pattern formation.

The above mentioned object can be achieved by the below-mentioned present inventions. That is, the present invention provides a method for manufacturing an organic EL element comprising at least a patterned organic light emitting layer, wherein the patterning is conducted by etching with a protecting layer pattern laminated on an organic light emitting layer.

Moreover, the present invention provides the method for manufacturing an organic EL element, wherein the protecting layer is made of a photosensitive resin, the protecting layer is formed by a printing method, the organic light emitting layer is insoluble or hardly soluble to a protecting layer forming solvent, the etching is conducted by dry etching, and the patterning for the organic light emitting layer is conducted for three times so as to allow a full color display of the EL element.

According to the present invention as mentioned above, a method for manufacturing an EL element, capable of preventing deterioration of the element characteristic by the developing agent, while providing the advantages of the photolithography method of high light emitting efficiency and taking out efficiency, the manufacturing process simplicity, and the highly sophisticated pattern formation, can be provided.

BEST MODE FOR CARRYING OUT THE INVENTION

Figure 1:
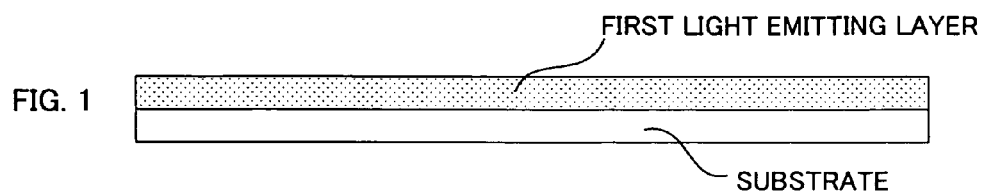
FIG. 1 is a diagram for explaining a method of the present invention, showing a first light emitting layer forming process.
Figure 2:
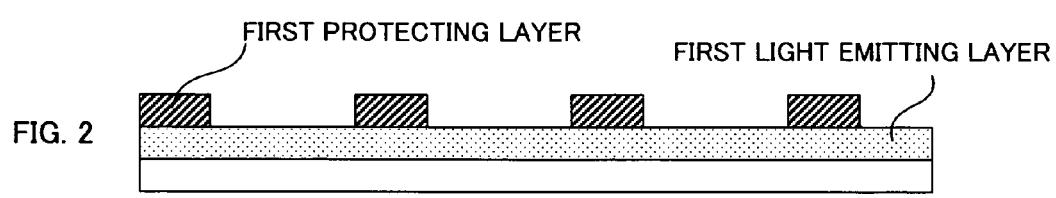
FIG. 2 is a diagram for explaining a method of the present invention, showing a first protecting layer forming process.
Figure 3:
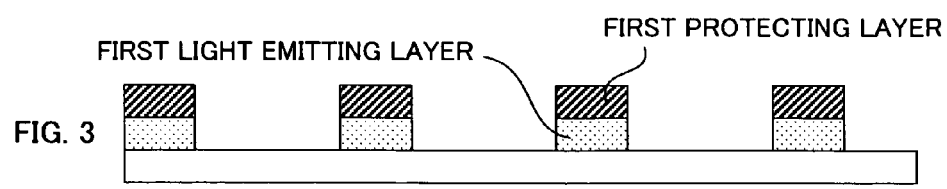
FIG. 3 is a diagram for explaining a method of the present invention, showing a first etching process.
Figure 11:
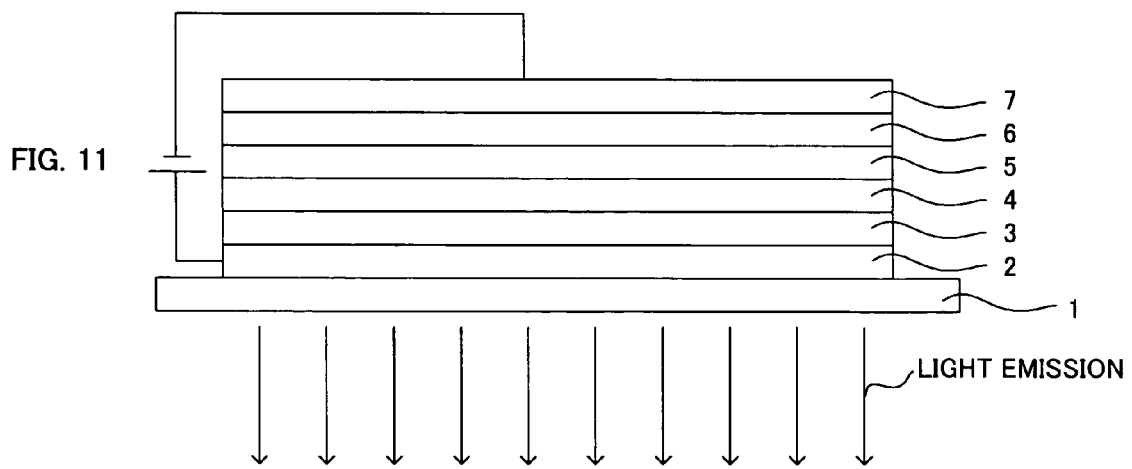
FIG. 11 is a diagram showing the basic configuration of an EL element, wherein the numeral 1 denotes a glass substrate, 2 denotes an anode, 3 denotes a buffer layer, 4 denotes a hole injection layer, 5 denotes an organic light emitting layer, 6 denotes an electron injection layer, and 7 denotes a cathode, respectively.

Next, with reference to preferable embodiments, the present invention will be explained in further detail. FIGS. 1 to 3 explain the basic embodiments of the present invention. FIG. 1 shows the state which an organic light emitting layer is formed on a glass substrate with a transparent electrode such as ITO, etc. formed thereon. At the time of forming the organic light emitting layer, a buffer layer, a hole injection layer, or the like may be formed preliminarily on the electrode as shown in FIG. 11. The forming process of the organic light emitting layer or the like is same as that in the conventional technology.

The present invention is characterized in that the organic light emitting layer patterning is executed by etching with a protecting layer pattern laminated on the organic light emitting layer. As shown in FIG. 12, such a protecting layer is formed with a material endurable to the subsequent etching into a desired pattern.

Next, as shown in FIG. 3, by a wet or dry method, preferably by dry etching the structure with the protecting layer formed thereon, the organic light emitting layer (buffer layer or the like) of the area without the protecting layer is removed, and furthermore, although it is not shown in the figure, by removing the remaining protecting layer, the organic light emitting layer is patterned. The pattern may be of any kind, and typically, a stripe type or a dot type can be listed.

Figure 4:
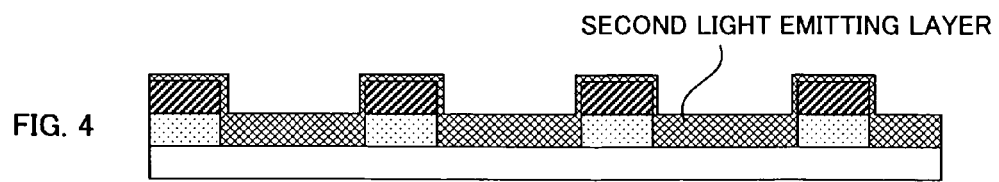
FIG. 4 is a diagram for explaining a method of the present invention, showing a second light emitting layer forming process.
Figure 5:
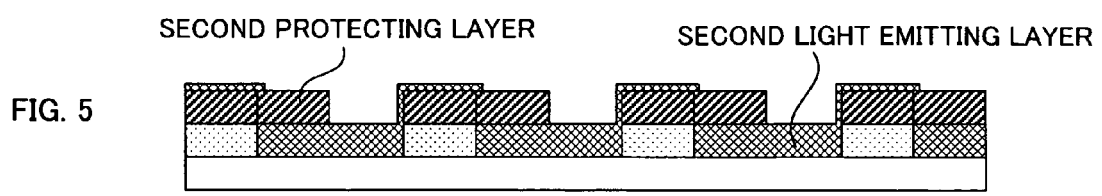
FIG. 5 is a diagram for explaining a method of the present invention, showing a second protecting layer forming process.
Figure 6:
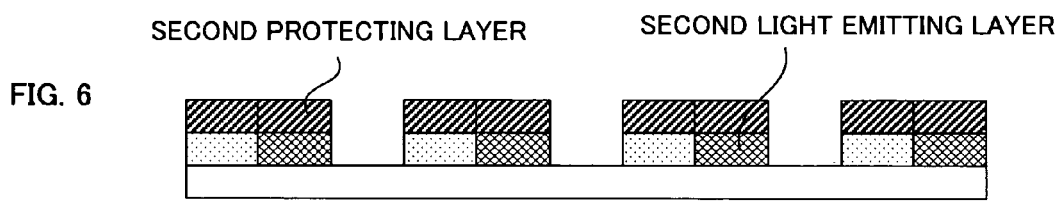
FIG. 6 is a diagram for explaining a method of the present invention, showing a second etching process.

FIGS. 4 to 10 show a method for forming an EL element capable of providing a full color display by further executing the above mentioned patterning for two times (total 3 times). In FIG. 3, another organic light emitting layer (second organic light emitting layer) is formed on the area where the first organic light emitting layer is removed, a second protecting layer is formed as shown in FIG. 5, a second etching process is executed as shown in FIG. 6, and the second light emitting layer patterning is executed by removing all the second light emitting layer except for the area of the second protecting layer.

Figure 7:
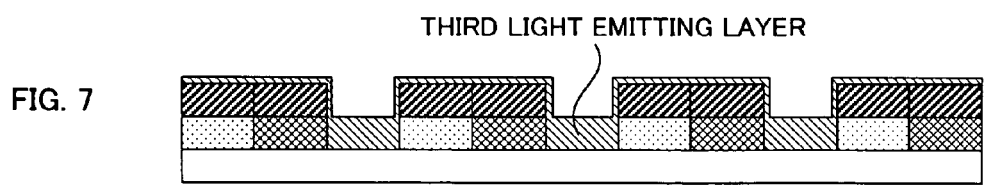
FIG. 7 is a diagram for explaining a method of the present invention, showing a third light emitting layer forming process.
Figure 8:
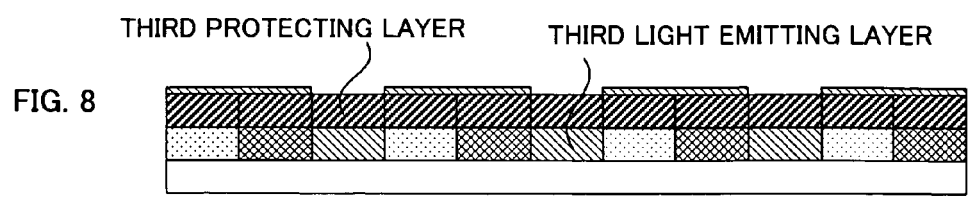
FIG. 8 is a diagram for explaining a method of the present invention, showing a third protecting layer forming process.
Figure 9:
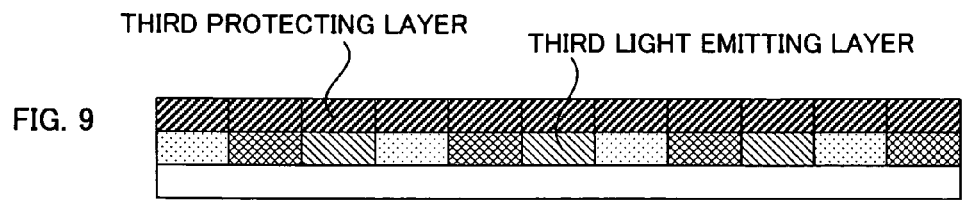
FIG. 9 is a diagram for explaining a method of the present invention, showing a third etching process.
Figure 10:
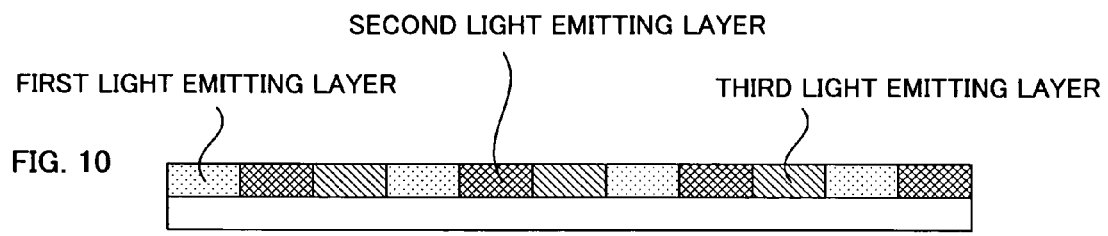
FIG. 10 is a diagram for explaining a method of the present invention, showing a third protecting layer peeling process.

Next, as shown in FIG. 7, a third organic light emitting layer is formed on the entire surface where the second etching treatment is conducted, a third protecting layer is formed as shown in FIG. 8, a third etching treatment is executed as shown in FIG. 9, and all the third light emitting layer, except for the area of the third protecting layer, is removed by etching. At last, by removing all the remaining protecting layer as shown in FIG. 10, and finally providing the configuration as shown in FIG. 11, an EL element capable of providing the full color display with organic light emitting layer of red (R), green (G) and blue (B) patterned, for example, like a stripe or a dot matrix can be provided.

The method of the present invention is as mentioned above, and each material and method used in the above mentioned present invention will be further explained.

(Substrate)

As the substrate for an EL element used in the present invention, a substrate of a glass, a transparent plastic sheet, or the like as used in the conventional EL elements may be used, and thus it is not particularly limited. The thickness of these substrates is, in general, about 0.1 to 0.2 mm.

(Electrode Layer)

In the present invention, a first electrode layer 2 is formed on a substrate 1 shown in FIG. 11, and moreover, a second electrode layer 7 is formed on the light emitting layer 5. Such an electrode layer may be one used in the conventional El elements, and thus it is not particularly limited. It is preferable that these electrode layers comprise an anode 2 and a cathode 7, with one of the anode 2 or the cathode 7 being transparent or translucent, and the anode 2 is made of a conductive material having a large work function so as to facilitate the injection of the hole. Moreover, it may be formed with a plurality of materials mixed together. In general, metal materials are used, but organic substances or inorganic substances may be used as well.

As a preferable anode material, for example, an indium oxide, a gold, or the like can be listed. As a preferable cathode material, for example, a magnesium alloy (Mg—Ag or the like), an aluminum alloy (Al—Li, Al—Ca, Al—Mg, or the like), a metal calcium and a metal having a small work function can be listed. The thickness of these electrode layers is, in general, about 20 to 1,000 Å per each.

(Charge Injection Layer)

As shown in FIG. 11, in the El element of the present invention, other layer may be formed in between the electrode layers 2, 7 and the light emitting layer 5. The layer includes a buffer layer, a hole injection layer and/or an electron injection layer. These are not particularly limited as long as they are those commonly used in the conventional El elements such as, for example, ones disclosed in the official gazette of the Japanese Patent Application Laid Open (JP-A) No. 11-4011.

(Light Emitting Layer)

The organic light emitting layer 5 formed on the first electrode layer 2, in general, is made of mainly an organic substance for emitting a fluorescent light (low molecule weight compound and a polymer compound) and a dopant for aiding the same. As such a light emitting material, for example, the below-mentioned materials can be listed.

1. Dye Based Material

As the dye based material, for example, a cyclopendamine derivative, a tetraphenyl butadiene derivative compound, a triphenyl amine derivative, an oxadiazol derivative, a pyrazoloquinoline derivative, a distylyl benzene derivative, a distylyl arylene derivative, a pyrrole derivative, a thiophene ring compound, a pyridine ring compound, a pelynone derivative, a pelylene derivative, an oligothiophene derivative, a trifumanyl amine derivative, an oxadiazol dimmer, a pyrazoline dimmer, or the like can be listed.

2. Metal Complex Based Material

As the metal complex based material, for example, a metal complex comprising an Al, a Zn, a Be, or the like, or a rare earth metal such as a Tb, an Eu, a Dy as the central metal, and an oxadiazol, a thiadiazol, a phenyl pyridine, a phenyl benzoimidazol, a quinoline structure, or the like as the ligand, such as an aluminum quinolinol complex, a benzoquinolinol beryllium complex, a benzoxazol zinc complex, a benzothiazol zinc complex, anazomethyl zinc complex, aporphyline zinc complex, an europium complex, or the like can be listed.

3. Polymer Based Material

As the polymer based material, a polyparaphenylene vinylene derivative, a polythiophene derivative, a polyparaphenylene derivative, a polysilane derivative, a polyacetylene derivative, a polyfluolene derivative, a polyvinyl carbazol derivative, a polymer of the above mentioned dye material, or metal complex based light emitting material, or the like can be listed.

Among the above mentioned light emitting materials, as the materials for emitting a blue light, a distyryl arylene derivative, an oxadiazol derivative, and a polymer thereof, a polyvinyl carbazol derivative, poloparaphenylene derivative, a polyfluolene derivative, or the like can be listed. In particular, the polymer materials such as a polyvinyl carbazol derivative, a polyparaphenylene derivative, a polyfluolene derivative, or the like are preferable.

Moreover, as the materials for emitting a green light, a quinacrydone derivative, a coumarine derivative, and a polymer thereof, a polyparaphenylene vinylene derivative, a polyfluolene derivative, or the like can be listed. In particular, the polymer materials such as a polyparaphenylene vinylene derivative, a polyfluolene derivative, or the like are preferable.

Moreover, as the materials for emitting a red light, a coumarine derivative, a thiophene ring compound, and a polymer thereof, a polyparaphenylene vinylene derivative, a polythiophene derivative, a polyfluolene derivative, or the like can be listed. In particular, the polymer materials such as a polyparaphenylene vinylene derivative, a polythiophene derivative, a polyfluolene derivative, or the like are preferable.

(Dopant Material)

A dopant can be added to the light emitting layer for the purpose of improving the light emitting efficiency, changing the light emitting wavelength, or the like. As such a dopant, for example, a perylene derivative, a coumarine derivative, a ruprene derivative, a quinacrydone derivative, a squarium derivative, a porphylene derivative, a styryl based dye, a tetracene derivative, a pyrazoline derivative, a decacyclene, a phenoxazone, or the like can be listed. The thickness of such organic light emitting layers is, in general, about 20 to 2,000 Å per each.

(Buffer Layer)

In the present invention, in addition to the process for forming a light emitting layer, a process for forming a buffer layer may be provided. The buffer layer in the present invention is a layer containing an organic substance, in particular, an organic conductive substance, provided in between an anode and a light emitting layer or in between a cathode and a light emitting layer so as to facilitate the injection of the charge into the light emitting layer. For example, it can be made of a conductive polymer having the function of improving the hole injection efficiency to the light emitting layer so as to flatten the ruggedness of the electrode or the like. The thickness of such buffer layer is, in general, about 100 to 2,000 Å.

When the conductivity of the buffer layer is high, it is preferable that it has the element diode characteristic, and it is patterned so as to prevent cross talking. When the resistance of the buffer layer is high, or the like, it dose not have to be patterned in some cases, and moreover, in the case of an element capable of omitting the buffer layer, the buffer layer dose not have to be provided in some cases.

As the material constituting the buffer layer, specifically, polymers of a hole transporting substance such as a polyalkyl thiophene derivative, a polyaniline derivative and a triphenyl amine, sol-gel films of an inorganic compound, polymer films of an organic substance such as a trifluoro methane, organic compound films containing a Lewis acid, or the like can be listed.

The method for forming such light emitting layer or buffer layer is same as the formation of an ordinary light emitting layer or the like, and thus it is not particularly limited. However, in addition to a vapor deposition method, an electrodeposition method, or methods using a molten liquid, a solution or a liquid mixture of materials such as a spin coating method, a casting method, a dipping method, a bar coating method, a blade coating method, a roll coating method, a gravure coating method, a flexo printing method, a spray coating method, or the like can be listed.

(Protecting Layer Forming Material)

The protecting layer which mainly characterizing the present invention has a function of preventing etching removal of the light emitting layer in the protecting layer formed area, and it is formed into a desired pattern by for example silk screen printing or the like, using, for example, an acrylate based photosensitive resin used conventionally for a photosensitive paint or a photosensitive ink, thermosetting or catalyst curing type resin such as an epoxy based, amino based, polyester based, or the like, a thermoplastic resin capable of forming a relatively strong film such as an acrylic based resin such as a methyl methacrylate, or a solution or a water based resin dispersion of a vinyl chloride resin, a vinyl acetate resin-vinyl chloride copolyer, a urea resin, having a high peeling suitability after patterning, as an ink. As the solvent in the ink used here, it is preferable to select a solvent which dose not dissolve the organic light emitting layer. Moreover, in the present invention, such a protecting layer is formed into a desired pattern on the organic light emitting layer by about 0.5 to 3.0 μm thickness.

Moreover, as to the formation of the protecting layer pattern which the protecting layer is formed in a pattern, it is preferable to carry out the same by the printing method. The printing method is not particularly limited as long as it is an ordinarily used printing method. For example, as the wet method, a gravure printing method, an offset printing method, a screen printing method, a flexo printing method, an ink jet method, or the like can be listed. As the dry method, a deposition method, a sputtering method, or the like can be listed. In the present invention, among the above, a screen printing method can be used preferably.

(Etching Method)

In the present invention, although the etching method for the light emitting layer (and the buffer layer) may be a wet method using a solvent or the like, however, dry etching which dose not adversely effect the light emitting layer is preferable. As the dry etching method, a reactive ion etching is preferable. By using the reactive ion etching, the organic light emitting layer is reacted chemically so as to be a compound having a small molecular weight so that it can be removed from the substrate by vaporization and evaporation, and thus a process with high etching accuracy can be enabled in a short time.

It is preferable to use oxygen itself or a gas containing an oxygen at the time of the above mentioned dry etching. By using the oxygen itself or the gas containing an oxygen, decomposition and removal of the organic light emitting layer by the oxidation reaction can be enabled so that the unnecessary organic substance can be removed from the substrate, and thus a process with high etching accuracy can be enabled in a short time. Moreover, under this condition, since the oxide transparent conductive film ordinarily used such as an ITO is not etched, it is effective also in that the electrode surface can be cleaned without deteriorating the electrode characteristics.

Furthermore, it is preferable to use the atmospheric pressure plasma for the above mentioned etching. By using the atmospheric pressure plasma, the dry etching, which in general requires the vacuum equipment, can be executed under the atmospheric pressure so that shortening of the processing time and reduction of the cost can be achieved. In this case, etching can be carried out, utilizing the oxidation and decomposition of the organic light emitting layer by the oxygen, as the plasma, in the atmosphere, but the gas composition in the reacting atmosphere can be adjusted optionally by substitution and circulation of the gas.

(Insulating Layer)

In the EL element of the present invention, an insulating layer may be provided preliminarily so as to cover the edge part of the patterned first electrode layer formed on the substrate and the non light emitting part of the element, with the light emitting part provided as an opening for preventing the short circuit at a part unnecessary for the light emission. According to the configuration, a defect of the element short circuit or the like can be reduced so that an element with a long life, capable of emitting the light stably can be obtained.

Such an insulating layer can be formed, for example, as a pattern with about 1 μm thickness by using an ultraviolet ray curing type resin or the like. When the light emitting layer is patterned by dry etching in the present invention, it is preferable that the insulating layer has the dry etching resistance. When the resistance is low, to prevent fracture by the dry etching, it is preferable to form the same by 1 μm or more film thickness, for example, 1.5 to 10 μm film thickness, more preferably, 2 to 5 μm film thickness.

EXAMPLES

Example 1

A patterned ITO substrate of a 6 inch square and 1.1 mm plate thickness was cleaned. 0.5 ml of a buffer layer coating solution (manufactured by Bayer Corp. Baytron P) was taken and dropped onto the center part of the substrate and executed the spin coating by maintaining at 2,500 rpm for 20 seconds to form a layer. As a result, the film thickness of the buffer layer was 800 Å.

As the first organic light emitting layer, spin coating was carried out by taking 1 ml of a coating solution (70 parts by weight of a polyvinyl carbazol, 30 parts by weight of an oxadiazol, 1 part by weight of adicyanomethylene pyran derivative, 4,900 parts by weight of a monochloro benzene) as a red color light emitting organic material and dropping onto the central part of the substrate on the buffer layer. By maintaining at 2,000 rpm for 10 seconds, a layer was formed. As a result, the film thickness of the first organic light emitting layer was 800 Å (FIG. 2).

As the first protecting layer, using a urea resin ethyl acetate solution (product name: Laropal, manufactured by BASF), by screen printing after matching the alignment, a protecting layer was formed on the first light emitting portion on the first organic light emitting layer. The film thickness of the protecting layer was 1 μm. Pre-baking was executed at 60° C. for 5 minutes. Then, by removing the organic light emitting layer and the buffer layer of the part without the protecting layer by dry etching, the first light emitting part was obtained (FIG. 3).

As the second buffer layer, as in the case of the above mentioned buffer layer, spin coating was carried out by taking 0.5 ml of a buffer layer coating solution (manufactured by Bayer Corp. Baytron P) and dropping onto the central part of the substrate. By maintaining at 2,500 rpm for 20 seconds, a layer was formed. As a result, the film thickness of the second buffer layer was 800 Å.

As the second organic light emitting layer, spin coating was carried out by taking 1 ml of a coating solution (70 parts by weight of a polyvinyl carbazol, 30 parts by weight of an oxadiazol, 1 part by weight of a coumarine 6, 4,900 parts by weight of a monochloro benzene) as a green color light emitting organic material and dropping onto the central part of the substrate. By maintaining at 2,000 rpm for 10 seconds, a layer was formed. As a result, the film thickness of the second organic light emitting layer was about 800 Å (FIG. 4).

As the second protecting layer, using a urea resin ethyl acetate solution (product name: Laropal, manufactured by BASF), by screen printing after matching the alignment, a second protecting layer was formed on the second light emitting portion on the second organic light emitting layer (FIG. 5). The film thickness of the protecting layer was 1 μm. Pre-baking was executed at 60° C. for 5 minutes. Then, by removing the organic light emitting layer and the buffer layer of the part other than the second light emitting portion by dry etching, the second light emitting part was obtained (FIG. 6).

As the third buffer layer, as in the case of the above mentioned buffer layer, spin coating was carried out by taking 0.5 ml of a buffer layer coating solution (manufactured by Bayer Corp. Baytron P) and dropping onto the central part of the substrate. By maintaining at 2,500 rpm for 20 seconds, a layer was formed. As a result, the film thickness of the third buffer layer was 800 Å.

As the third organic light emitting layer, spin coating was carried out by taking 1 ml of a coating solution (70 parts by weight of a polyvinyl carbazol, 30 parts by weight of an oxadiazol, 1 part by weight of a perylene, 4,900 parts by weight of a monochloro benzene) as a blue color light emitting organic material and dropping onto the central part of the substrate. By maintaining at 2,000 rpm for 10 seconds, a layer was formed. As a result, the film thickness of the third organic light emitting layer was 800 Å (FIG. 7).

As the third protecting layer, using a urea resin ethyl acetate solution (product name: Laropal, manufactured by BASF) by screen printing after matching the alignment, a third protecting layer was formed on the third light emitting portion on the third organic light emitting layer (FIG. 8). The film thickness of the third protecting layer was 1 μm. Pre-baking was executed at 60° C. for 5 minutes. Then, by removing the organic light emitting layer and the buffer layer of the part other than the third light emitting portion by dry etching, the third light emitting part was obtained (FIG. 9).

By soaking the obtained substrate into an ethyl acetate bath for removing all the protecting layers on the first to third organic light emitting layers, the patterned organic light emitting layer was bared (FIG. 10). After drying at 100° C. for 1 hour, by vapor depositing Ca by 500 Å as the second electrode layer on the obtained substrate, and furthermore, Ag by 2,500 Å thickness as the protecting layer, an EL element was manufactured (FIG. 11). With the ITO electrode side connected to the positive electrode and the Ag electrode side to the negative electrode, a direct current was applied by a source meter. R, G, B light emission was observed from the first to third light emitting parts respectively at the time of applying 10 V.

The invention claimed is:

1. A method for manufacturing an organic EL element comprising at least a patterned organic light emitting layer,
   wherein the patterning is conducted by etching with a protecting layer pattern laminated directly on an organic light emitting layer, and wherein the protecting layer pattern is formed by a printing method.

2. The method for manufacturing an organic EL element according to claim 1, wherein the organic light emitting layer is insoluble or hardly soluble to a protecting layer forming solvent.

3. The method for manufacturing an organic EL element according to claim 1, wherein the etching is conducted by dry etching.

4. The method for manufacturing an organic EL element according to claim 1, wherein the patterning for the organic light emitting layer is conducted for three times so as to allow a full color display of the EL element.

5. The method for manufacturing an organic EL element according to claim 1, wherein, prior to the patterning, a buffer layer is formed on a substrate, and the organic light emitting layer is further formed on the buffer layer; and the patterning is conducted by etching the organic light emitting layer and the buffer layer with the protecting layer pattern laminated directly on the organic light emitting layer by the printing method.

6. The method for manufacturing an organic EL element according to claim 1, wherein, prior to the formation of the organic light emitting layer, an insulating layer is formed by covering an edge part of a patterned first electrode layer formed on a substrate and a non light emitting part so as to provide a light emitting part as an opening part.

7. A method for manufacturing an organic EL element comprising:
   a light emitting layer forming process of forming an organic light emitting layer on a substrate with a first electrode layer formed,
   a protecting layer forming process of forming a protecting layer of a desired pattern directly on the organic light emitting layer by a printing method,
   an etching process of removing by etching the organic light emitting layer in an area without the protecting layer and patterning the organic light emitting layer,
   a protecting layer peeling process of removing the protecting layer after the etching process, and
   a second electrode layer forming process of forming a second electrode layer on the organic light emitting layer after the protecting layer peeling process.

8. The method for manufacturing an organic EL element according to claim 7, wherein the organic light emitting layer is insoluble or hardly soluble to a protecting layer forming solvent.

9. The method for manufacturing an organic EL element according to claim 7, wherein the etching is conducted by dry etching.

10. The method for manufacturing an organic EL element according to claim 7, wherein the processes of the light emitting layer forming process to the etching process are repeated for three times so as to allow a full color display of the EL element.

11. The method for manufacturing an organic EL element according to claim 7, wherein, prior to the light emitting layer forming process, a buffer layer forming process of forming a buffer layer on the substrate with a first electrode layer formed is conducted; and in the etching process, the organic light emitting layer and the buffer layer in the area without the protecting layer are removed by etching to conduct the patterning of the organic light emitting layer and the buffer layer.

12. The method for manufacturing an organic EL element according to claim 7, comprising, prior to the light emitting layer forming process, an insulating layer forming process of forming an insulating layer by covering an edge part of a patterned first electrode layer formed on the substrate and a non light emitting part so as to provide a light emitting part as an opening part.

* * * * *